Sept. 21, 1971 R. J. RYAN 3,606,677

MULTILAYER CIRCUIT BOARD TECHNIQUES

Filed Dec. 26, 1967 3 Sheets-Sheet 1

Inventor:
ROBERT J. RYAN

BY Edward J. Norton
Attorney

INVENTOR
ROBERT J. RYAN
BY Edward J. Norton
ATTORNEY

Sept. 21, 1971 R. J. RYAN 3,606,677

MULTILAYER CIRCUIT BOARD TECHNIQUES

Filed Dec. 26, 1967 3 Sheets-Sheet 3

INVENTOR
ROBERT J. RYAN
BY Edward J. Norton
ATTORNEY

United States Patent Office 3,606,677
Patented Sept. 21, 1971

3,606,677
MULTILAYER CIRCUIT BOARD TECHNIQUES

Robert J. Ryan, Trenton, N.J., assignor to RCA Corporation

Filed Dec. 26, 1967, Ser. No. 693,672
Int. Cl. B41m 3/08
U.S. Cl. 29—625 7 Claims

ABSTRACT OF THE DISCLOSURE

The disclosed technique comprises the lamination of two or more circuit boards using a controlled flow adhesive layer; the controlled flow adhesive permitting through holes to remain unobstructed after lamination. Final interconnection is made by plating through the holes, thereby providing the requisite interconnections between surfaces.

BACKGROUND OF THE INVENTION

The use of printed circuitry in the electronics industry dates back approximately twenty years. Over that period of time technical refinements have progressed to the point where the phrase "printed circuits" is now a household term familiar to the consumer. Furthermore, the advent of microelectronics during the past ten years has caused circuit technology to change drastically. To gain the advantage of integrated circuit technology, modern packaging concepts require that multilayer interconnection circuits be provided having fine line conductor patterns and controlled impedance circuits with close tolerances. Computer technology, for example, often demands tightly controlled printed circuit interconnections having multiple ground, voltage, and circuit planes containing 10±2 mil conductor lines separated by as little as five mils. Circuit to ground impedances often must be controlled to within tolerances of ±6 percent. Future needs will demand even finer-line circuit patterns, greater reliability, and higher packaging densities. It may become necessary to interconnect several circuit elements which are made of different materials, mounted flush in a circuit board. Integration of laminated ferrite memories with drivers and sense amplifiers is one example of such a structure.

SUMMARY OF THE INVENTION

This invention relates to a novel method of fabricating a multilayer composite which may be used for interconnecting systems requiring high density packaging such as computer systems which incorporate integrated circuits.

Basically, the method comprises the lamination of two or more circuit boards using a controlled flow adhesive layer; the controlled-flow adhesive permitting through holes to remain open after lamination. Final interconnection is made by plating through the holes, thereby providing the requisite interconnections between surfaces.

Accordingly, it is an object of the present invention to provide a method of fabricating a multilayer circuit board wherein any dielectric material, or a combination thereof, can be used as circuit substrates.

An additional object is to provide such a method wherein circuit boards of different dielectric materials and thickness can be used to control electrical properties as in the case of strip line applications for computer circuits.

A further object is to provide a method of making a multilayer circuit board which utilizes single and/or double sided circuit boards formed by either an additive or a subtractive process.

Another object of the present invention is to provide a multilayer circuit fabrication technique which can be accomplished with conventional processing equipment.

BRIEF DESCRIPTION OF THE DRAWING

The foregoing objects, along with additional objects and applications, will become more readily apparent to those skilled in the art upon reading the specification which follows in conjunction with the accompanying FIGS. 1 through 4 which are representative of process steps associated with the present invention and include corresponding cross sectional views of the circuit substrates at the respective steps in accordance with preferred embodiments thereof.

DESCRIPTION OF PREFERRED EMBODIMENTS

Figure 1:
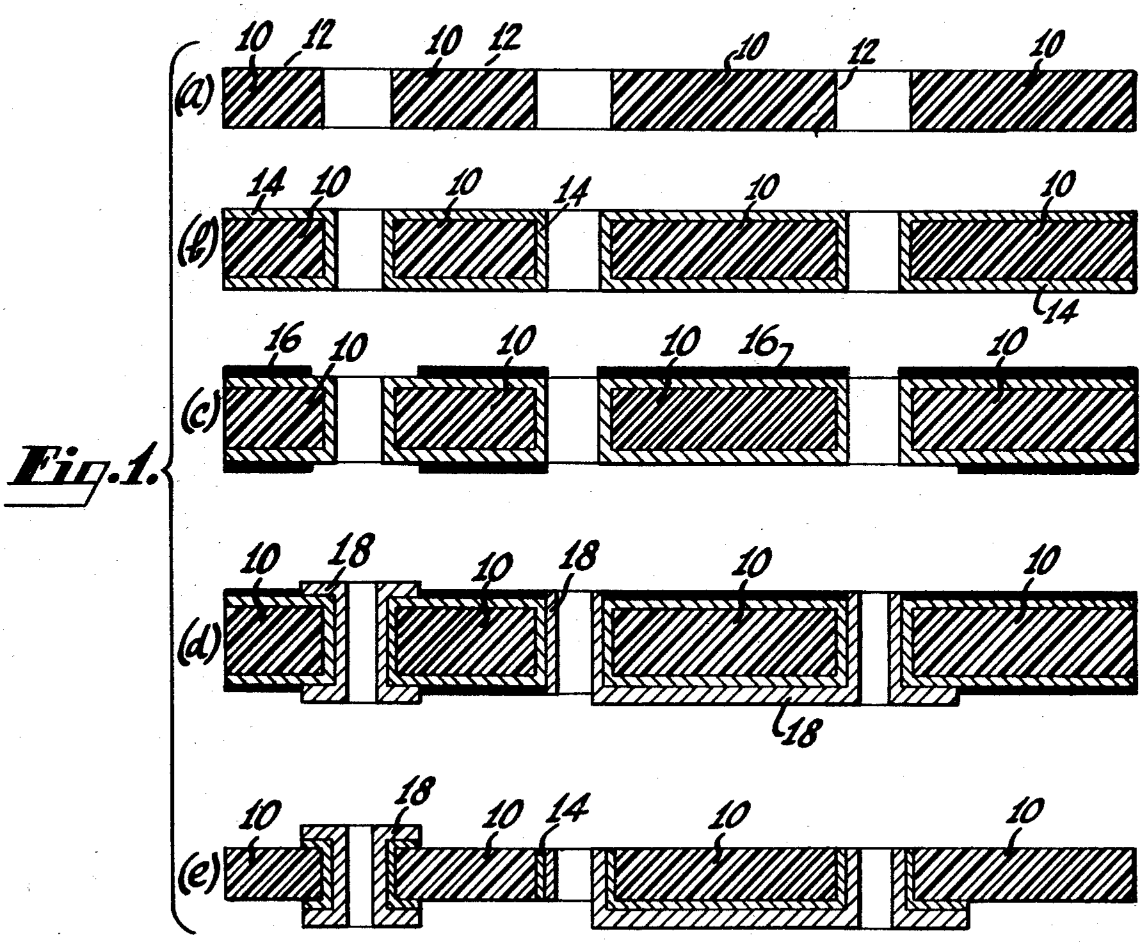

Two methods generally available for the fabrication of printed circuit boards are the subtractive-etch method and the additive-buildup method.

The majority of printed circuits produced for commercial use today are fabricated using the subtractive-etch method. This method generally comprises laying down a pattern on a resist coated copper clad board, utilizing either positive or negative artwork, and delineating the desired circuit pattern by etching away the surrounding copper.

Additive methods, wherein the coppr circuitry is added to a base substrate, have been less commonly used in the past. With the advent of double sided boards incorporating plated through holes however, the additive methods offer substantial advantages. As in the case of the subtractive-etch method, the additive method may be carried out utilizing positive or negative printing techniques. Accordingly, although the present invention should not be construed as being so limited, the preferred embodiments will be described in relation with an additive buildup method utilizing negative printing techniques.

Of the various additive methods available for building up conducting layers on nonconducting substrates, chemical and electro-chemical deposition offer the most versatile approach.

Chemical deposition is accomplished by controlled autocatalytic reduction of a metal ion from solution, and is commonly referred to as electroless deposition. Methods are well established for the electroless deposition of copper and nickel, and several systems are available with proven performance on the metallization of nonconductors. Electro-deposition of metals is also well proven in industry.

The electroless method consists of treating a dielectric substrate with a catalytic metal to render the substrate receptive to subsequent chemical reduction of a desired metal ion, thus effecting plating. In addition to copper and nickel, other metals such as gold and silver have proven readily adaptable to electroless deposition techniques. Palladium solutions are most commonly used as the activating metal. Typically, palladium salt solutions are reduced at active sites on the substrate by tin chloride. The palladium then acts as a catalytic surface for subsequent deposition of the metal; for example copper. The plating solutions normally consist of a metal salt, a complexing agent, and a reducing agent. Stability of the solution is controlled by the low concentration of free metal ions in equilibrium with the complex. Once reduction of the metal has occurred on the active palladium sites, the process becomes autocatalytic and the deposition proceeds across the surface of the substrate.

One advantage of the additive method is the availability of a variety of substrate materials which can be used. Plastics evaluated for electroless copper metallizing and additive buildup circuitry include polysulfane, polycarbonates, polyacetals, polyurethanes, acrylics, polyesters, fluorocarbons, phenolics, and epoxies. Other materials evaluated, in addition to plastics, include alumina and beryllia ceramics as well as glass and plastic coated metals. Generally, most untreated dielectric substrates produce a uniform, though weakly bonded, copper layer. Adhesion may be greatly improved by various surface treatments such as chemical etching, physical abrasion, or the addition of an adhesive primer film.

FIG. 1 traces a process for fabricating a double sided circuit board having plated through holes, utilizing an additive-buildup, negative pattern technique.

The dielectric substrate 10, shown therein, is punched, drilled or etched in accordance with the desired location of the plated through holes; punching being preferred over drilling, particularly for small holes, due to greater simplicity, better definition, and lower cost. The exposed surfaces of the substrate 10 are then prepared by a cleaning step and a chemical or physical treatment to promote the adhesion of the circuitry. Typically, the treatment may involve acid etching of the surface, or vapor blasting to abrade the surface. This is followed by degreasing and cleaning. Other chemical promoters such as titanium esters and siloxanes are also useful. The substrate 10 is then sensitized for electroless deposition by coating the exposed surfaces with a catalytic material 12. Typical of the compounds which may be used are the salts of tin, titanium, silver, gold, platinum and palladium. A $PdCl_2$-$SnCl_2$ sensitizer has proven particularly effective. This treatment deposits a fine layer of metallic palladium 12 on the surface of the substrate 10 which acts as a nucleus for metal deposition during the subsequent electroless step. In some instances it may be possible to purchase the dielectric substrate already impregnated with a catalytic material, thereby eliminating the cleaning and sensitizing steps. Thereafter, all exposed surfaces of the substrate 10 are subjected to an electroless bath for a period of time sufficient to permit the formation of a conductive foundation 14 thereupon which will be receptive to subsequent electroplating; e.g., an initial layer of copper, approximately ten microinches in thickness, can be deposited in approximately ten minutes utilizing standard electroless baths. For some circuits, particularly where high currents are involved, a thin electroplated layer of .00005" to .0001" in thickness may be deposited over the electroless layer using a conventional plating bath. A negative mask pattern 16 of the desired circuitry is then printed on either side of the thinly plated substrate 10 using conventional printing methods. Any printing technique can be used including silk screening and hand blocking. However, since the additive process does not require the use of strong etch solutions for long periods of time, and permits the direct use of thin ink printing techniques, a dry or wet offset process has been found preferable for printing on flat substrates. Offset techniques permit high product output, excellent definition and resolution, and the utilization of standard printing equipment. The inks used for the negative circuit mask pattern 16 can be almost any conventional printing ink or other like material which completely covers the surface within the masked areas, is resistant to the plating solution, and is electrically insulating; commercially available acid resist offset inks have been found to produce excellent results. It is necessary to cover the thinly plated surface to isolate it from the electroplating solution to prevent buildup of the circuit where such buildup is not desired, during the electroplating step. Thereafter, the circuitry 18 is built up to the desired conductor thickness utilizing almost any electroplating technique available, the choice being determined by the substrate, the desired metal, and the circuit requirements. The negative masking pattern 16 is then removed by washing and rinsing in a suitable solvent. After removal of the masking pattern, any of the thin initial conductive layer 14 which is still exposed is removed by a flash etch.

Alternatively, if it be desirable to entirely eliminate any etching step, the initial electroless deposition 14 can be performed subsequent to the application of the negative mask pattern. In such case it is important that the ink be chosen so as not to be receptive to the deposition of metal by the subsequent plating steps.

In either event it should be noted that the desired circuitry is deposited on portions of the substrate which have not previously been obscured by either photoresist solutions or inks. This provides an added benefit in that it insures against circuit contamination which may occur in the event pre-existing layers of said materials are not completely removed prior to circuit deposition.

As previously discussed, multilayer circuitry has attained significant importance in the printed circuit field today primarily due to the major effort of the electronics industry in integrated circuit development. There are a variety of methods presently in use for fabricating multilayer circuit boards. Basically, these methods can be separated into two groups: (1) laminated multilayer boards, and (2) built-up multilayer boards. Of the two, boards fabricated by the built-up method are less common. These are fabricated by alternately building up conductor patterns by electro-deposition and screening on insulating layers, or by using a sequential lamination of individual clad circuit boards where the interconnections are plated down through blind holes, and the circuitry then defined upon the board by etching through a resist layer. In the case of multilayer boards using the laminated technique, all layers are laminated in one step.

In producing multilayer printed circuit boards by laminating together two or more individual circuit board substrates having open through holes, it has been found desirable to utilize an adhesive whose physical characteristics can be controlled during the laminating process. The adhesive should exhibit sufficient flow at the laminating pressure and temperature to provide the intimate contact between adjacent circuit board layers which is necessary for good bonding. At the same time, the adhesive should be sufficiently viscous so as not to flow into the through hole interconnection areas of the circuit boards. The viscosity can be regulated by rigid control of the laminating cycle, i.e., temperature, pressure time, or through the formulation of special adhesive blends. For example, by formulating a double resin adhesive system, wherein one resin reacts at a relatively low curing temperature to increase the viscosity of the adhesive and the other resin reacts at a relatively high temperature to effect the desired adhesive bond, controlled resin flow during the laminating process, which is carried out above the lower curing temperature, may be achieved.

More specifically, an adhesive containing a high temperature di-functional epoxy resin may be employed; alternately an adhesive mixture containing a high temperature di-functional epoxy resin and a relatively low temperature polyfunctional epoxidized novolak resin such as phenol formaldehyde condensate, may be used. Four examples of different formulations of this type are set forth in Table I.

TABLE I

| Adhesive formulation Number | 1 | 2 | 3 | 4 |
|---|---|---|---|---|
| Dicyandiamide (DCD), g | 0.36 | .639 | 1.197 | 1.755 |
| Dimethylacetamide (DMAc), cc | 12 | 12 | 12 | 12 |
| Carbitol acetate, cc | 14 | 14 | 14 | 14 |
| Union Carbide ERR-2010 (difunctional), g | 30 | 27 | 21 | 15 |
| Union Carbide ERR-0100 (polyfunctional), g | 0 | 3 | 9 | 15 |
| Benzyldimethylamine (BDMA) (.15 g./cc. in Carbitol acetate | 1 | 1 | 1 | 1 |

Sample tests revealed that 8 mil glass epoxy may be coated with a 2 mil layer of adhesive, partially cured at 144 degrees centigrade and laminated at 170 degrees centigrade and a pressure of 100 pounds per square inch with satisfactory results. The corresponding pre-cure characteristics are set forth in Table II.

TABLE II

| Adhesive formulation | Ratio of di-functional to polyfunctional resin (Union Carbide ERR-2010/ERR-0100) | Minimum cure time at 114° C. for controlled resin flow | Approximate useful precure time range |
|---|---|---|---|
| 1 | 100-0 | 2 hours | 2-3 hours. |
| 2 | 90-10 | 45 minutes | 45-75 minutes. |
| 3 | 70-30 | 20 minutes | 20-60 minutes. |
| 4 | 50-50 | 12 minutes | 12-45 minutes. |

Glass epoxy samples laminated in the aforementioned manner exhibited good adhesive properties, and the adhesive did not flow into 40 mil through holes formed in the laminate.

The adhesives described and represented in Table I may be prepared by dissolving the DCD in DMAc and Carbitol acetate, adding the resins and stirring with a magnetic stirrer until all resin is in solution, at which time the BDMA is added.

An important advantage of these mixed resin systems is that cure of the more reactive poly-functional resin component without significant cure of the less reactive difunctional component provides a relatively non-critical cure cycle. Shelf life in the partially cured state is also extended. Formulations of mixed resin systems can be made to produce desired curing and laminating cycles by varying the type and ratio of the resin components.

Other reactive components such as phenolics, polyamides, or polysulfides can be utilized to provide a controlled flow mixed resin system. Polyamides and polysulfides produce a more flexible system which can improve bond strength and provide other desirable properties. Thickening agents such as silica can also be added to the adhesive blends to aid in the control of resin flow without affecting cure or shelf life.

Figure 2:
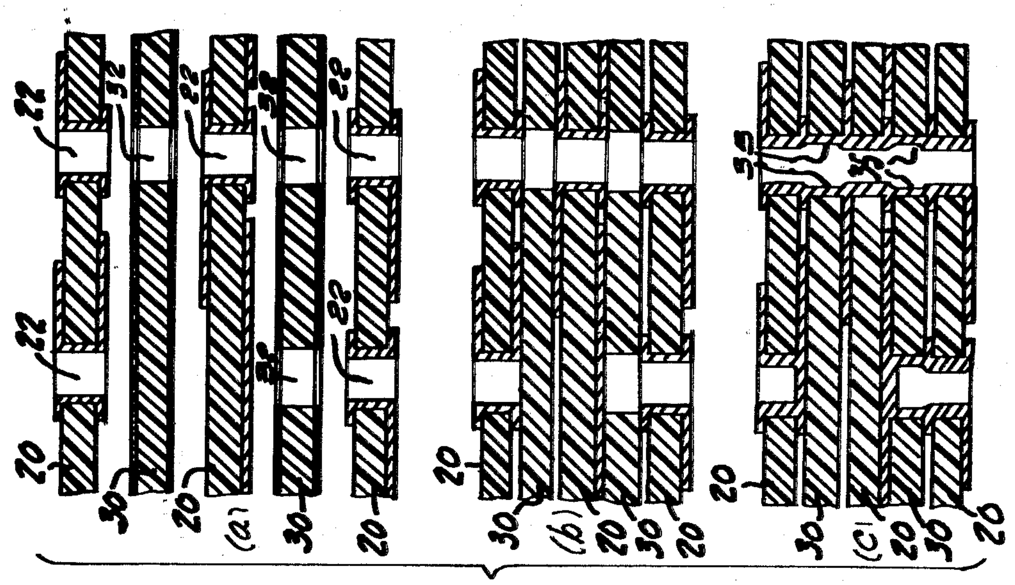

FIG. 2 depicts the steps in the formulation of a multilayer circuit board utilizing three double sided circuit boards 20 having plated through holes 22, fabricated in accordance with the method represented by FIG. 1, and laminated with adhesive coated dielectric substrates 30 wherein the adhesive is of the type described supra. The processing steps as illustrated in FIG. 2 entail the following:

The adhesive supporting substrates 30 are punched or drilled to form holes 32 which will register in the desired manner with the plated through interconnection holes 22 of the double sided boards 20. Alternately, the controlled flow adhesive may be applied directly to the planar surfaces of the double sided boards using roller coating or printing techniques. Care must be taken to insure that the through holes are left exposed.

The adhesive layers 30 are then sandwiched between the double sided boards 20, with all holes 22, 32 in proper registration, and laminated in a laminating press under controlled conditions of temperature, pressure, and time; these parameters varying as a function of the materials used. Thereafter the laminate is removed from the press and permitted to cool.

Final board interconnecting is achieved by plating across the adhesive-insulating layer separation in the through holes using electroless and/or electroplating methods. This may be accomplished in any one of a number of ways. For example, the entire laminated structure could first be coated with a sacrificial layer of electrolessly deposited copper; the outer substrate surfaces masked off with a resist impervious to plating, leaving the through holes exposed; plating up the through holes utilizing electroplating techniques; stripping off the plating resist; and finally subjecting the entire assembly to a flash etch to remove the sacrificial layer previously deposited. Should it be found desirable, the conductive circuitry upon the exterior surfaces of the laminated assembly could be formed at the same time that the through holes are plated.

A more specific description of the method discussed in association with FIG. 2 is presented in Example 1 infra:

Example 1

Multilayer circuit board fabricated by the lamination of double sided circuit boards using a single resin controlled flow adhesive.

Board material:

Type GXXP Phenolic .015" thick coated with Shipley 200 TF primer;

Controlled flow adhesive #25456-69-II:

10 grams Bakelite ERRA-2011 epoxy resin (Union Carbide) (70% resin dissolved in Carbitol Acetate);
0.8 cc. dicyandiamide in dimethylformamide (.28 g. dicyandiamide);
0.022 g. benzyldimethylamine;
0.07 cc. siliane A-1100 (Union Carbide);
0.5 g. Cabosil.

(a) Two 0.15" XXXP sheets are coated on both sides with a layer .001 to .003" thick (dry film) of the above adhesive and partially cured at 121° C. for 50-60 minutes.

(b) The adhesive coated sheets plus three uncoated sheets of XXXP are punched with .040" holes in predetermined positions.

(d) Three double sided circuit boards having plated through holes are processed from the uncoated sheets using the method outlined in FIG. 1 and described previously.

(d) The double sided circuit boards are stacked alternately with the adhesive coated sheets, using a lamination jig with registration pins so that all through holes are in registration; the adhesive coated sheets being disposed within the stack. A thin sheet of silicone resin or other resilient material is placed in the jig to equalize pressure during lamination. The assembly is then laminated at 100-200 p.s.i. at 171° C. for 30-60 minutes in a heated platen laminating press and cooled to room temperature.

(e) The exterior surfaces of the laminated assembly, and the exposed surfaces of the holes, are sensitized as previously described and coated with a thin layer of electroless copper. A masting ink is then applied over the electroless layers leaving the interior of the through holes open. The holes are then electroplated to complete the connections between the double sided boards. The masking ink is then removed and the thin exposed electroless layer removed by flash etching.

While it will generally be desirable to us a dielectric substrate for supporting the adhesive, a conductive support may be used which can then serve as a ground plane or shield between layers.

Figure 3:
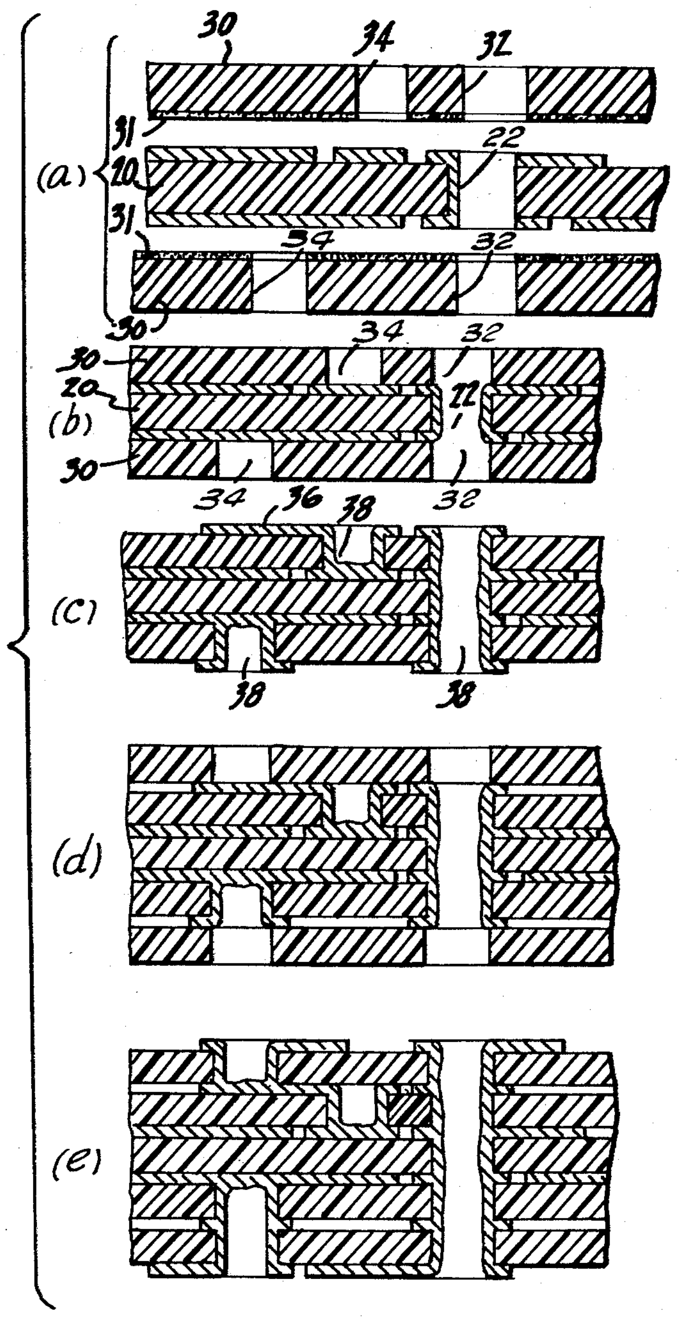

FIG. 3 depicts the steps in the fabrication of a multilayer assembly utilizing one double sided board as a starting basis and building up therefrom on either side, utilizing a controlled flow adhesive, to form the completed multilayer assembly. The processing steps as illustrated in FIG. 3 entail the following:

Dielectric substrates 30, precoated on one side 31 with a controlled flow adhesive and pre-cured at proper temperature-time conditions, are punched or drilled to form holes 32 in registration with the plated through hole 22 within the double sided board 20 and as otherwise desired 34.

The double-sided board 20 is then sandwiched between the adhesive surfaces 31 of the dielectric substrates 30 and laminated thereto.

Conductive circuitry 36, as desired, is then formed on the exposed surfaces of the dielectric substrate as described in the explanation of FIG. 1. At the same time exposed surfaces of any holes 38, be they through holes 22, 32 or restricted via holes 34 are plated up.

The foregoing steps may then be repeated as necessary to build up the board with the desired number of layers;

e.g., FIG. 3*d–e*. It should be noted that this process can be used to form buried layer interconnections as well as feed through connections. The burned interconnection provides for more than one separate interconnection per location on the board, thus providing greater packaging density. The feed through type connection builds up in metallic thickness toward the base layer as adjacent layers are processed. All conductor circuits and interconnections are built up of continuous copper from layer to layer with good reliability. Each circuit layer and interconnection can be tested through the processing with easy repair or reprocessing possible. Etchants are applied for only short periods of time, and no plated etch resists are required. The method is not restricted to substrate composition or thickness, and different materials and thicknesses can be easily used to control electrical and physical properties. The buried type of interconnection is much less critical than a through hole and does not require critical drilling or registration.

A more specific description of the method discussed in association with FIG. 3 is set forth in Example 2 infra:

EXAMPLE 2

Multilayer circuit board fabricated by the sequential lamination of preperforated dielectric layers over a double sided core layer using a double resin controlled flow adhesive and additive circuit processing.

Board Materials:

Type Eg–752 GEE–UC (.008" thick) glass reinforced epoxy (G–10 grade) Mica Corp.

Controlled flow adhesive #26367–82–41:

3 g. Bakelite ERR–0100 epoxy resin
27 g. Bakelite ERR–2010 epoxy resin
0.639 g. dicyandiamide
12 cc. dimethylformamide
15 cc. Carbitol acetate
0.15 g. benzyldimethylamine
0.225 cc. linseed oil (a) The epoxy sheets are roughened mechanically to a fine matte finish by vapor blasting to improve adhesion of subsequent coatings.

(b) A double sided core layer is processed using the method outlined in FIG. 1 and described previously.

(c) Epoxy sheets are coated with a continuous film of the the controlled flow adhesive, such that after drying the film thickness will be about .001"–.003" thick. The adhesive is then partially cured at 144° C. for 20 minutes. The sheets are then punched or drilled with a 0.35" hole pattern to align with the circuit pattern of the core layer and laminated in a jig with registration pins at 100–200 p.s.i. for five minutes at 171° C. and allowed to cool to room temperature.

(d) Circuits are then fabricated on the outer layers using methods outlined in FIG. 1. Interconnections are through between layers in the open access holes and through holes during the circuit buildup.

(e) Processing is continued with the lamination of additional adhesive coated layers and circuit buildup as in Steps (c) and (d) above until the required number of layers are obtained. The final insulating layers are laminated at 171° C. and 100–200 p.s.i. pressure for 30–60 minutes to fully cure all adhesive layers. The board is completed with the fabrication of the outer circuit layers.

The multilayer circuit boards described previously in Examples 1 and 2 were fabricated using controlled flow adhesives coated directly onto the dielectric substrates. As an alternate method, thin unsupported controlled flow adhesive films or adhesive films coated on both sides of a thin insulating support film can be used in place of the adhesive coated sheets. An example of this method is given below.

Example 3

Multilayer circuit board fabricated by the lamination of double sided circuit boards using a controlled flow adhesive coated on both sides of a support film.

Board Material:
.010" thick polysulfone thermoplastic sheet
Adhesive film:
Circuit Materials Co. Type CMC–X–626 (.001" polyimide film coated on both sides with .001" of thermoset modified polyester).

(a) The polysulfone sheets are annealed in glycerine at 160° C. for three minutes and .010" diameter holes ther then punched in the required circuit interconnect positions. The punched polysulfone layers are next chemically treated to improve adhesion of subsequently plated copper. Supported adhesive films are also punched with the same hole pattern as above.

(b) Two double sided circuit boards are processed using the method outlined in FIG. 1. These boards include, for example, one having a circuit plane on one surface (which will form the outer layer of the multilayer board) and a voltage plane on the other surface (which will form the outer layer of the multilayer assembly). The other board may have a circuit plane on one surface and a ground plane on the other. All hole surfaces are coated with copper during the circuit buildup and connections provided to voltage or ground planes where required.

(c) The two double sided boards are then placed into a laminating jig with a supported, prepunched adhesive layer inbetween and positioned with registration pins to align all holes. A thin sheet of silicone resin is placed in the jig to equalize pressure and the assembly then laminated in a heated platen press at a temperature of 350° F. for seven minutes and a pressure of 100 p.s.i. The jig is removed from the press and allowed to cool to room temperature before removing the laminated board.

(d) The entire board including the inner hole surfaces is then coated with a layer of copper .00005" thick and the outer surfaces coated with a masking ink by roller coating. The through holes are then electroplated to complete the connections between the double sided boards. The masking ink is then removed and the thin exposed layer of copper removed by flash etching.

In addition to multilayer circuit boards fabricated with organic insulating layers and organic adhesives, multilayer boards can be fabricated from single or double sided inorganic substrates using inorganic bonding materials. An example of this type of board is summarized as follows:

Example 4

Materials:
High alumina ceramic substrates (AlSi Mag 614 American Lava Corp.)
Glass frit bonding layer:
Vitta Corp., Cat. #G1002 glass transfer tape.

(a) Perforated alumina substrates are formed having through holes in the required positions for interconnections and registration. Holes are normally punched in the green ceramic prior to firing, compensating for the shrinkage that will occur.

(b) Two double sided circuits are processed on the alumina substrates using the method outlined in FIG. 1.

(c) Holes are punched in the glass transfer bonding layer in positions to align with holes of the double sided aluminia circuits.

(d) The two double sided boards are positioned in a laminating jig with the glass frit bonding layer inbetween using registration pins. The assembly is then placed in a furnace and fired at a maximum temperature of up to 850° C. under sufficient pressure to bond the two double sided layers together. The firing cycle and furnace atmosphere is controlled to burn off organic binder in the glass frit and to prevent extensive oxidation of the circuitry at the higher temperatures. The assembly is then cooled to room temperature and the laminated board removed.

(e) The entire surface of the laminated board, including the through holes, is coated with a thin layer of metal by electroless and/or electrodeposition. The outer surfaces are covered with a plating mask ink and the through hole interconnections completed by electroplating. The masking ink is removed and the thin exposed metal layer removed by flash etching.

As an alternate approach to the above example, double layer circuits could be processed on preperforated alumina substrates using fired-on thick film circuitry (e.g., using screened Pd-Ag or Ag thick film conductor inks) and laminated as above. The final circuit interconnections would then be made as above using electroless and electroplating techniques.

Figure 4:
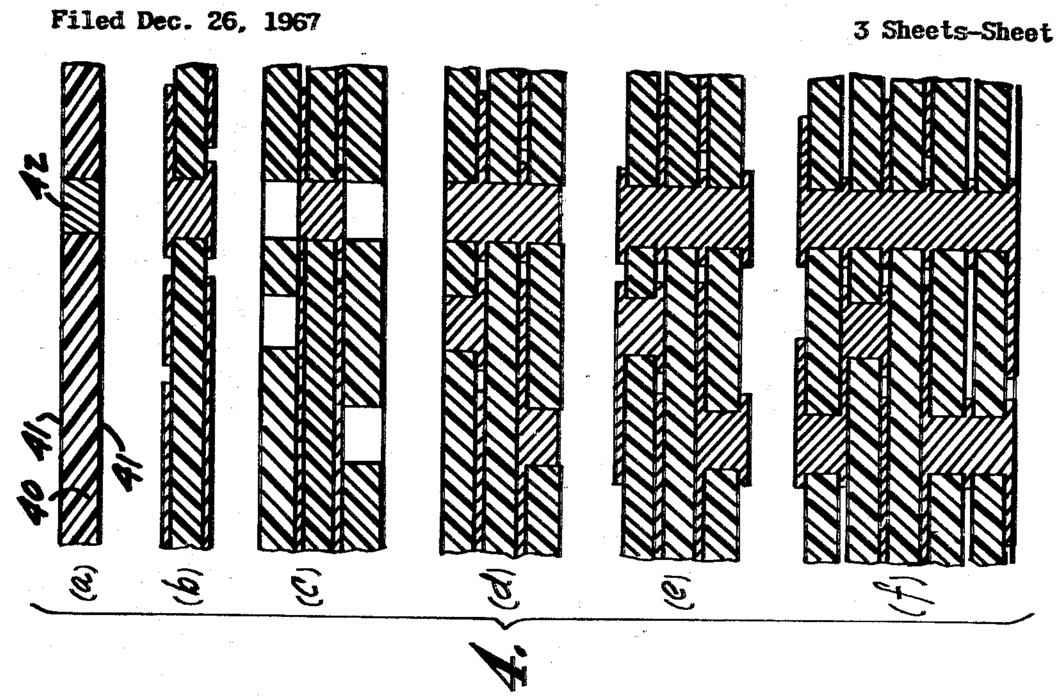

FIG. 4 illustrates a method of making a multilayer board wherein solid interconnecting risers are formed by plating up the copper in the interconnecting holes prior to sensitizing. To fabricate the multilayer circuit depicted in FIG. 4 the interconnecting holes 42 are plated up to the surfaces 41 of the substrate 40 in which they are formed prior to sensitizing those surfaces 41. For best results the plated up risers require resurfacing flush with the surface of the board to be subsequently laminated, unless plating is restricted and controlled so as to stop slightly below the surface level. The process is continued in a manner similar to that described in the discussion associated with FIG. 3. No problems are encountered with the negative printing method in forming interconnections between the conductor lines and the solid metal risers. Interconnections with solid plated up risers have been made at plating current densities up to 460 ma./in.$^2$ in a stirred bath with good results. The solid plated up riser provides a highly reliable interconnection between layers, though requiring a prolonged plating period.

In summation, the techniques disclosed for fabricating multilayer circuit boards provide significant advantages over those techniques previously used. Among them:

(a) An opportunity of performing circuit tests from layer to layer throughout processing, thereby permitting easy repair and insuring reliability and yield;

(b) It is not layer limited nor is it restricted to a small variety of substrate materials;

(c) Substrates of different thicknesses and electrical properties can be used either alone or in combination;

(d) Solid, non-solid, buried, and feed through type interconnections can be made separately or in combination, thus offering maximum circuit design flexibility;

(e) Offset printing techniques can be readily utilized thereby offering the advantage of fine line resolution with good control and high productivity;

(f) Photoresist techniques are eliminated;

(g) Various metals can be used for the conductive circuitry;

(h) Prolonged etching steps are eliminated; and (i) Conventional processing equipment can be utilized thus obviating the need for additional capital expenditures for equipment.

What is claimed is:

1. The method of manufacturing a multilayer composite having metallized through holes, comprising the steps of:

(a) providing at least two circuit boards formed with through holes;

(a1) metallizing the surface of each circuit board defining said through holes;

(b) aligning said boards to provide registration of said through holes as desired;

(c) interposing between said boards a layer of adhesive, said adhesive layer formed with holes in like registration, said adhesive comprising a two-resin component mixture, one of said resins reacting at a relatively low temperature to increase the viscosity of the mixture, the other of said resins reacting at a relatively high temperature for bonding said circuit boards;

(c1) partially curing said adhesive layer at the temperature to cure said one resin;

(d) laminating said substrates and said partially cured adhesive layer to provide a multilayer composite having through holes unobstructed by said adhesive, said adhesive exhibiting sufficient flow at the laminating pressure and temperature to provide the intimate contact between adjacent substrates which is necessary for good bonding, while being sufficiently viscous so that said through holes remain unobstructed by said adhesive after lamination; and (e) metallizing the surfaces of said multilayer composite defining said through holes to provide a continuously metallized through connection.

2. The method as defined in claim 1 wherein step (c) more specifically comprises interposing between said boards a substrate coated on opposite surfaces thereof with said adhesive, said coated substrate formed with holes in like registration.

3. The method of manufacturing a multilayer composite as defined in claim 6 wherein step (c) more specifically comprises, interposing between said boards a layer of an adhesive mixture comprising a first resin which reacts at a relatively low curing temperature, and a second resin which reacts at a relatively high temperature, said adhesive layer formed with holes in like registration.

4. The method of manufacturing a multilayer composite having metallized holes which serve to interconnect the circuitry upon the various layers thereof, comprising the steps of:

(a) providing a circuit board formed with holes;

(a1) metallizing the surface portions of the circuit board defining said holes;

(b) interposing said circuit board between two substrates, each of said substrates formed with holes, at least one of said holes in each of said substrates being in axial alignment with one of said holes in said circuit board, said substrates coated on the surfaces proximate said circuit board with adhesive;

(b1) partially curing the adhesive, said adhesive comprising a two-resin component mixture, one of said resins reacting at a relatively low temperature to increase the viscosity of the mixture, the other of said resins reacting at a relatively high temperature for binding said circuit boards coated on said substrates at the temperature to cure said one resin;

(c) laminating the assembly to provide a multilayer composite at the temperature to effect bonding by said other resin, said adhesive exhibiting sufficient flow at the laminating pressure and temperature to provide the intimate contact between adjacent substrates which is necessary for good bonding, while being sufficiently viscous so that said through holes remain unobstructed by said adhesive after lamination; and (d) depositing conductive circuitry on the exterior surfaces of said structure and within the exposed peripheral surfaces of said holes.

5. The method as defined in claim 4 wherein step (d) more specifically comprises plating conductive circuitry on the exterior surfaces of said structure and within the exposed surfaces of the assembly defining said holes.

6. The method of manufacturing a multilayer structure as defined in claim 4 wherein step (b) more specifically comprises, coating said substrates with an adhesive mixture comprising a first resin which reacts in a relatively low curing temperature, and a second resin which reacts at a relatively high temperature.

7. The method of manufacturing a multilayer structure as defined in claim 6 wherein, said first resin comprises a relatively low temperature poly-functional epoxidized phenol formaldehyde condensate, and said second resin comprises a relatively high temperature di-functional epoxy resin.

References Cited

UNITED STATES PATENTS

| | | | |
|---|---|---|---|
| 2,456,006 | 12/1948 | Hickler | 156—90 |
| 2,992,954 | 7/1961 | Nelson et al. | 156—330X |
| 3,386,956 | 8/1968 | Nawakowski | 161—Epoxy |
| 3,102,213 | 8/1963 | Bedson et al. | 29—626UX |
| 3,340,607 | 8/1967 | Shutt | 29—625 |
| 3,356,786 | 12/1967 | Helms | 29—625X |
| 3,397,452 | 8/1968 | Taraud | 29—628X |
| 3,265,664 | 8/1966 | Fulmer et al. | 156—313X |
| 3,332,817 | 7/1967 | Obenhaus | 156—313 |

FOREIGN PATENTS

| | | | |
|---|---|---|---|
| 569,037 | 6/1966 | Canada | 156—330 |
| 611,216 | 7/1946 | England. | |

OTHER REFERENCES

Epon Resins by Shell Co., p. 15, Nov. 9, 1950, in Paint, Oil & Chemical Review.

Electronic Packaging with Resins by Harper, published 1961, p. 62, relied upon.

Plastic Engineers Handbook, 1961 ed., pp. 495–498.

JOHN F. CAMPBELL, Primary Examiner

R. W. CHURCH, Assistant Examiner

U.S. Cl. X.R.

29—628; 174—68.5; 156—313, 314, 330

UNITED STATES PATENT OFFICE
CERTIFICATE OF CORRECTION

Patent No. 3,606,677 Dated September 21, 1971

Inventor(s) Robert J. Ryan

It is certified that error appears in the above-identified patent and that said Letters Patent are hereby corrected as shown below:

Column 2 line 29 "coppr" should be --copper--; Column 5 column 3 of Table II "114°" should be --144°--; Column 6 line 10 "GXXP" should be --XXXP--; line 22 "0.15" should be --.015--; line 50 "us" should be --use--; Column 7 line 49 delete the first "the"; line 52 "0.35" should read --.035--; line 59 "are through between" should read --are formed between--; Column 8 line 14 "ther" should read --are--; Column 10 line 6 after "adhesive layer" should be inserted --at the temperature to effect bonding by said other resin--; Column 10 line 23 "Claim 6" should read --Claim 1--; Column 10 line 46 after "adhesive" should read --said adhesive comprising a two-resin component mixture, one of said resins reacting at a relatively low temperature to increase the viscosity of the mixture, the other of said resins reacting at a relatively high temperature for bonding said circuit boards--; Column 10 lines 47-52 should read to delete ",said adhesive comprising... binding said circuit boards".

Signed and sealed this 28th day of March 1972.

(SEAL)
Attest:

EDWARD M.FLETCHER,JR.
Attesting Officer

ROBERT GOTTSCHALK
Commissioner of Patents